United States Patent
Cuzzocrea et al.

(10) Patent No.: US 8,673,740 B2
(45) Date of Patent: Mar. 18, 2014

(54) METHOD FOR FORMATION OF AN ELECTRICALLY CONDUCTING THROUGH VIA

(75) Inventors: Julien Cuzzocrea, Saint Sernin du Bois (FR); Laurent-Luc Chapelon, Domene (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/616,288

(22) Filed: Sep. 14, 2012

(65) Prior Publication Data
US 2013/0084687 A1    Apr. 4, 2013

(30) Foreign Application Priority Data

Sep. 30, 2011 (FR) .................................... 11 58794

(51) Int. Cl.
*H01L 21/762* (2006.01)
*H01L 21/66* (2006.01)

(52) U.S. Cl.
USPC ........... 438/458; 438/459; 438/675; 438/118; 438/406; 438/977; 257/E21.567; 257/E21.57; 257/E27.161; 257/E21.008; 257/E23.128

(58) Field of Classification Search
CPC ........... H01L 2225/06541; H01L 2924/35121; H01L 21/76254; H01L 21/76259
USPC ......... 438/458, 459, 675, 118, 406, 455, 977; 257/E21.567, E21.57, E27.161, 257/E21.088, E21.122, E21.568, E23.128
See application file for complete search history.

(56) References Cited

U.S. PATENT DOCUMENTS

| | | | |
|---|---|---|---|
| 6,555,443 B1 * | 4/2003 | Artmann et al. | 438/458 |
| 8,093,136 B2 * | 1/2012 | Endo et al. | 438/458 |
| 2001/0005043 A1 | 6/2001 | Nakanishi et al. | |
| 2004/0099950 A1 * | 5/2004 | Ohsumi | 257/738 |
| 2004/0188861 A1 | 9/2004 | Kurimoto et al. | |
| 2004/0198026 A1 * | 10/2004 | Chu et al. | 438/479 |
| 2005/0112885 A1 * | 5/2005 | Rayssac et al. | 438/689 |
| 2005/0133930 A1 * | 6/2005 | Savastisuk et al. | 257/774 |
| 2006/0121690 A1 * | 6/2006 | Pogge et al. | 438/455 |
| 2007/0048896 A1 * | 3/2007 | Andry et al. | 438/106 |
| 2007/0190746 A1 * | 8/2007 | Ito et al. | 438/455 |
| 2007/0194397 A1 * | 8/2007 | Adkisson et al. | 257/432 |
| 2008/0073785 A1 * | 3/2008 | Shiota | 257/738 |
| 2009/0189256 A1 | 7/2009 | Yoshimura et al. | |
| 2009/0311828 A1 * | 12/2009 | Andry et al. | 438/107 |
| 2009/0315188 A1 * | 12/2009 | Anderson et al. | 257/774 |
| 2009/0325343 A1 * | 12/2009 | Lee | 438/107 |
| 2010/0032808 A1 | 2/2010 | Ding et al. | |

(Continued)

*Primary Examiner* — Jarrett Stark
*Assistant Examiner* — Bitew Dinke
(74) *Attorney, Agent, or Firm* — Allen, Dyer, Doppelt, Milbrath & Gilchrist, P.A. Attorneys at Law

(57) ABSTRACT

A method is for formation of an electrically conducting through-via within a first semiconductor support having a front face and comprising a silicon substrate. The method may include forming of a first insulating layer on top of the front face of the first semiconductor support, fabricating a handle including, within an additional rigid semiconductor support having an intermediate semiconductor layer, and forming on either side of the intermediate semiconductor layer of a porous region and of an additional insulating layer. The method may also include direct bonding of the first insulating layer and of the additional insulating layer, and thinning of the silicon substrate of the first semiconductor support so as to form a back face opposite to the front face.

18 Claims, 9 Drawing Sheets

(56) References Cited

U.S. PATENT DOCUMENTS

| | | |
|---|---|---|
| 2010/0190334 A1* | 7/2010 | Lee ............................... 438/637 |
| 2010/0248427 A1 | 9/2010 | Wu et al. |
| 2011/0037161 A1* | 2/2011 | Andry et al. .................. 257/692 |
| 2011/0233785 A1* | 9/2011 | Koester et al. ................ 257/773 |
| 2011/0291234 A1* | 12/2011 | Lee ............................... 257/532 |
| 2011/0298021 A1* | 12/2011 | Tada et al. ..................... 257/288 |
| 2012/0013013 A1* | 1/2012 | Sadaka et al. ................. 257/773 |
| 2012/0156859 A1* | 6/2012 | Chapelon et al. ............. 438/458 |
| 2012/0306082 A1* | 12/2012 | Sekar et al. ................... 257/758 |
| 2013/0026627 A1* | 1/2013 | Chapelon ...................... 257/737 |
| 2013/0037922 A1* | 2/2013 | Arriagada et al. ............. 257/652 |

* cited by examiner

METHOD FOR FORMATION OF AN ELECTRICALLY CONDUCTING THROUGH VIA

FIELD OF THE INVENTION

The present disclosure relates to integrated circuits and, more particularly, to three-dimensional integrated structures comprising an assembly of at least two integrated circuits.

BACKGROUND OF THE INVENTION

Integrated circuits generally comprise, adjacent their front face, an interconnection network (BEOL: Back End Of Line) comprising metal lines. In order to form an electrical link between metal lines of two integrated circuits assembled front face against back face (or "back to front"), electrically conducting through-vias are formed, commonly denoted by the acronym TSV: Through Silicon Via. These links can be formed prior to the fabrication of the interconnection network of the integrated circuit, by forming a conducting pillar from the front face of the integrated circuit extending into the silicon substrate, then by thinning this substrate from its back face, the pillar then being exposed on the new back face. The electrically conducting through-via thus formed is a link of the "TSV Middle" type according to a terminology known to those skilled in the art.

It is also possible to fabricate an electrically conducting through-via after the formation of the interconnection network (approach referred to as "TSV Last"). In order to fabricate such an electrically conducting through-via, the silicon substrate is thinned from its back face so as to form a new back face. A new cavity is then formed on this back face opening onto a line of the interconnection network and an electrically conducting layer is formed on the sidewalls of the cavity in contact with the line, bringing an electrical contact onto the new back face.

During the thinning steps allowing the formation of the electrically conducting through-vias, the integrated circuits from the same semiconductor wafer are assembled with a wafer forming a rigid support or a handle. Typically, the wafer forming a rigid support is fixed by way of an adhesive on the front face of the integrated circuits. This front face can be covered with copper pillars and it is therefore necessary to use a layer of adhesive covering these pillars.

After the fixing to a rigid support by an adhesive, it may be difficult to implement fabrication steps at high temperatures, for example, greater than 250° Celsius. Furthermore, once the integrated circuit is completed, the step for removal of the rigid support may damage the integrated circuits. One approach is to slide the rigid support towards the outside during an anneal step. Drawbacks of this approach may comprise that it allows thinning of the semiconductor supports by around only 80 micrometers in thickness, and it may require cleaning of the layer of adhesive.

Another approach may comprise using a rigid support having a plurality of cavities through which a chemical agent capable of cleaning the adhesive is passed in order to detach the support. This approach may have limitations in temperature due to the use of adhesive.

SUMMARY OF THE INVENTION

According to one embodiment, electrically conducting through-vias may be formed without using adhesive for fixing a rigid support. According to one aspect, a method is for the formation of an electrically conducting through-via within a first semiconductor support having a front face and comprising a silicon substrate. The method may comprise forming a first insulating layer on top of the front face of the first semiconductor support, and fabricating a handle comprising, within an additional rigid semiconductor support, for example, having a thickness on the order of several hundred micrometers, and an intermediate semiconductor layer. The formation may be on either side of the intermediate semiconductor layer of a porous region and of an additional insulating layer. The method may also include direct bonding of the first insulating layer and of the additional insulating layer, and thinning of the silicon substrate of the first semiconductor support so as to form a back face opposite to the front face.

The electrically conducting through-via may be formed from the back face subsequent to the thinning step ("TSV last") or from the front face prior to the thinning step ("TSV Middle" or "TSV First"), the electrical link then being exposed after thinning on the back face. Thus, by forming the first insulating layer and the additional insulating layer, the direct bonding, in other words a molecular bonding, of these two layers can be implemented with no adhesive used for fixing a rigid support, in other words the handle.

The formation of the porous region can comprise implanting dopant atoms into the rigid additional support so as to form a buried doped region on one side of the intermediate semiconductor layer, forming at least one cavity passing through the intermediate semiconductor layer and opening into the buried doped region, and forming pores in the buried doped region by an electrochemical process.

The at least one cavity may provide access to the buried doped region to implement the electrochemical process. By means of an electrical contact on the edge of the rigid additional support, a current can be made to flow through an electrolytic solution (comprising, for example, hydrofluoric acid) and porosification of the buried doped region can be obtained.

When an electrically conducting through-via of the "TSV Middle" or "TSV First" type is formed, the electrically conducting through-via can be formed prior to the thinning step by forming a conducting pillar extending from adjacent the front face of the semiconductor support into the silicon substrate of the first support. The thinning step will then allow the bottom of the pillar to be reached.

The back face of the first support, from where the electrically conducting through-via comes out, may be assembled with a front face of a second semiconductor support, the first and second semiconductor supports forming a three-dimensional integrated structure. The method can comprise a fracturing of the porous region so as to separate, on the one hand, the residual semiconductor layer, the additional insulating layer being bonded to the insulating layer of the first support, and on the other hand, the rest of the rigid additional support.

The porous layer may be easily fractured to remove the rigid additional support. Thus, a chemical method has not been used to remove an adhesive. Furthermore, the rigid additional support can be reused to implement another method for formation of an electrically conducting through-via. The first semiconductor support can comprise an interconnection network, for example, of the BEOL type, situated adjacent its front face and a conducting pillar formed from a metal line of this interconnection network passing through the insulating layer of the first support and the additional insulating layer and protruding from a free face of the first support opposite the back face of the first support.

The second semiconductor support can be situated within a semiconductor wafer. The first support can be situated prior to the step for assembly with the second support within a semiconductor wafer diced for the assembly step, and an assembly of the "die to wafer" type is then formed. It is also possible not to dice up the semiconductor wafer and to assemble two wafers, for example, in an assembly of the "wafer to wafer" type.

BRIEF DESCRIPTION OF THE DRAWINGS

Other advantages and features of the invention will become apparent upon studying the detailed description of embodiments, taken by way of non-limiting examples and illustrated by the appended drawings in which.

DETAILED DESCRIPTION OF THE PREFERRED EMBODIMENTS

With reference to FIGS. 1A, 1B, 1C and 1D, the steps for fabrication of a handle within a rigid support SR will be described. The rigid support SR can, for example, be a semiconductor wafer comprising silicon, and its thickness can be on the order of several hundred micrometers, for example, 700 micrometers. Furthermore, a silicon wafer having a doping of the n type (producing an excess of electrons) can be used.

Figure 1A:
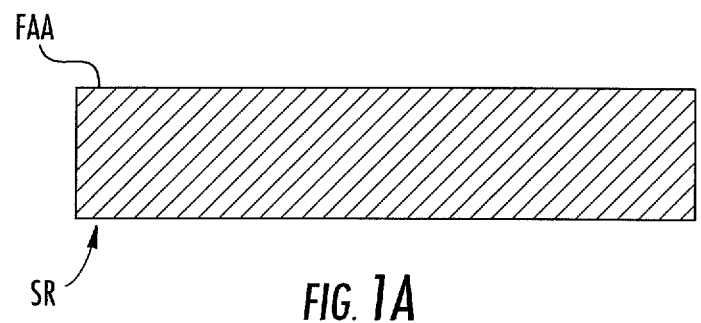
FIGS. 1A, 1B, 1C, 1D are cross-section views of steps of a method according to the present embodiment.
Figure 1B:
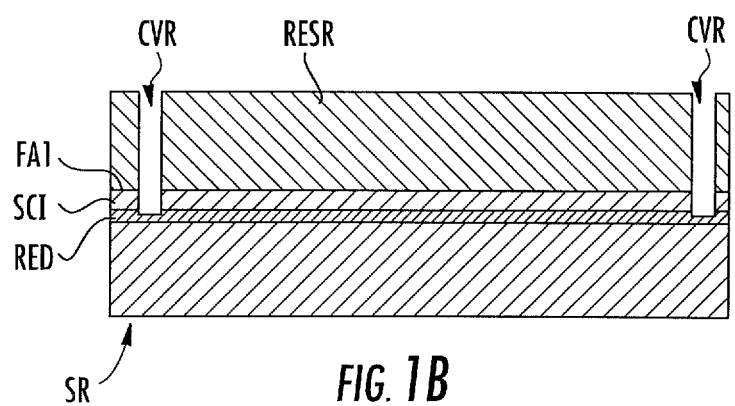

A step for implantation of atoms, for example, of boron, can be implemented from the face FAA of the support SR (FIG. 1B). The parameters of this implantation step (energy, temperature, duration, etc.) are chosen to obtain a buried doped region RED under an intermediate semiconductor layer SCI having a thickness of around 20 micrometers. Cavities CVR, here shown to be two in number, are then formed during a photolithographic step in which a photoresist RESR is opened up to form the cavities CVR which pass through the layer SCI and open into the buried doped region RED. These cavities CVR can have a width of around 10 micrometers.

Figure 1C:
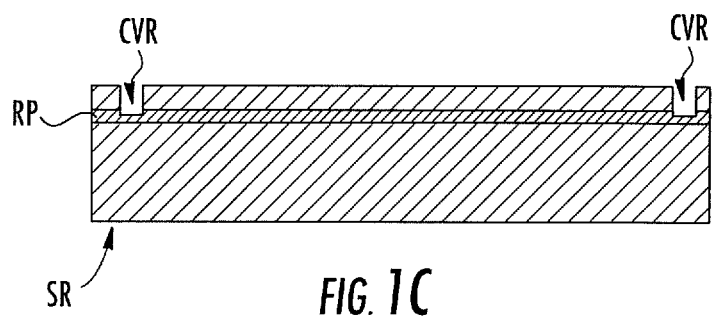
Figure 1D:
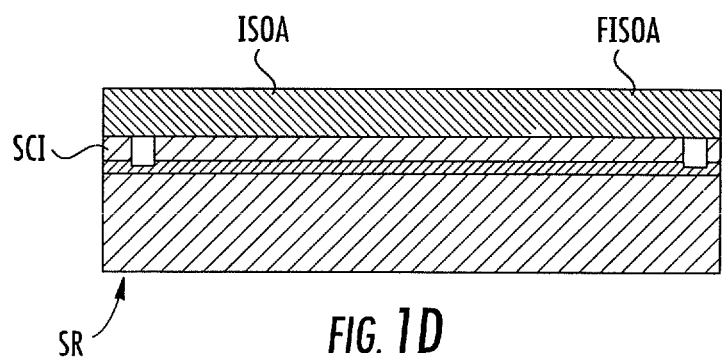

As illustrated in FIG. 1C, the photoresist RESR can be removed to form, through the cavities, a porous region in the support SR. An electrochemical process is implemented via the cavities CVR, and the silicon of the buried doped region RED (p-doped) is transformed faster than the rest of the support SR into porous silicon. As shown in FIG. 1d, an additional insulating layer ISOA can subsequently be formed, for example, of silicon dioxide ($SiO_2$), on top of the intermediate semiconductor layer SCI, for example, by way of a chemical vapor-phase deposition (CVD) step. The additional insulating layer ISOA can have a thickness on the order of 500 nanometers.

Figure 2:
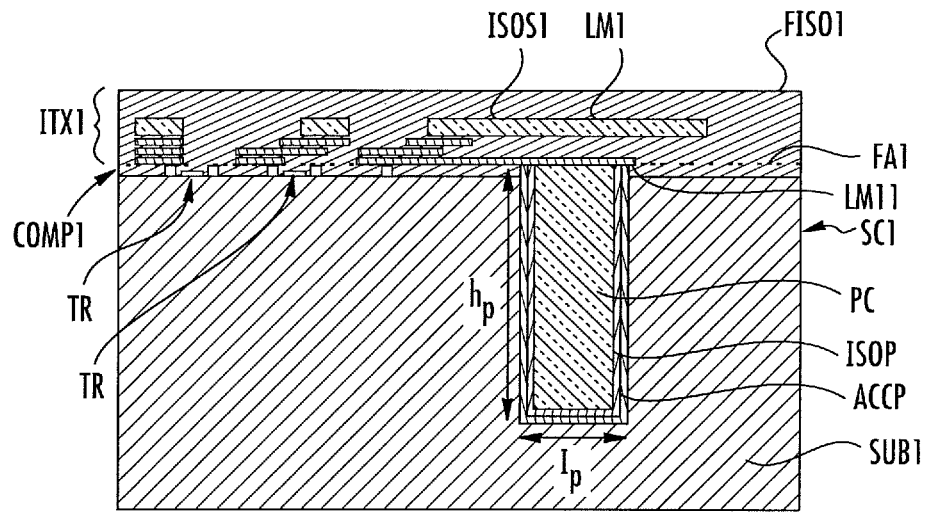
FIG. 2 is a cross-section view of a semiconductor support SC1 situated within a wafer, according to the present embodiment.

In FIG. 2, a semiconductor support SC1 is shown, for example, situated within a wafer. The support SC1 comprises a front face FA1, here disposed on top of a region comprising components COMP1. Such a region COMP1 is known to those skilled in the art by the acronym "FEOL: Front End Of Line" and comprises, for example, transistors TR. On top of its front face FA1, an interconnection network ITX1 is formed, for example, a network of the BEOL type, comprising a plurality of metal lines and vias, and notably a line LM1, for example, situated on the highest metallization level, and a line LM11, for example, situated on the lowest metallization level of the interconnection network ITX1.

After the formation of the region COMP1 and prior to the formation of the interconnection network ITX1, a conducting pillar PC has been formed, comprising copper, from the front face FA1, passing through the region COMP1 and extending into the substrate SUB1, for example, a silicon substrate, of the support SC1. The metal line LM11 will be formed on top of and in electrical contact with the pillar PC. The pillar PC is partially encapsulated within an insulating layer ISOP and a layer ACC, for example, comprising tantalum, tantalum nitride (TaN), and copper. These materials may be deposited by physical vapor deposition (PVD) steps, the layer ACC allowing the diffusion of the copper into the silicon to be prevented and allowing the adherence of the copper that will fill the pillar PC. The pillar PC can, for example, have a height hp of around 15 micrometers and a width lp of around 3 micrometers.

Figure 3:
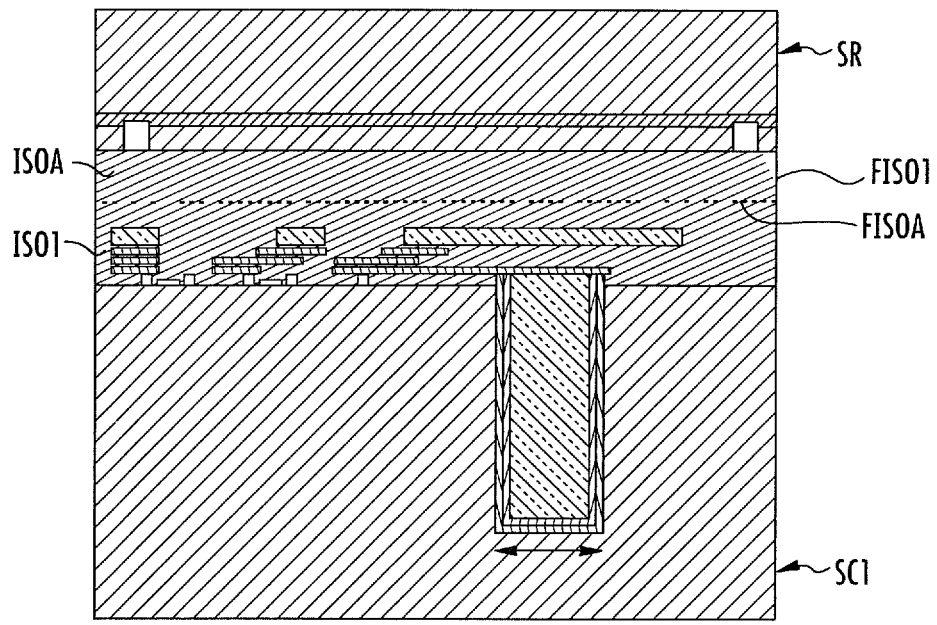
FIG. 3 is a cross-section view of the faces being directly bonded, according to the present embodiment.

The metal lines and the vias of the interconnection network ITX1 are encapsulated within an insulating region ISOS1, for example, of silicon dioxide, whose free face FISO1 is designed to be bonded to a free face FISOA of the additional insulating layer shown in FIG. 1D. Thus, as illustrated in FIG. 3, the faces FISO1 and FISOA are directly bonded, in other words without using adhesive material. Prior planarization and surface preparation steps may have been implemented to facilitate such a bonding. It will be noted that this bonding is facilitated by the use of the same material for the layer ISOA and the region ISOS1, for example, silicon dioxide. Once these two layers have been bonded, the rigid support SR and the first semiconductor support SC1 form a sufficiently rigid assembly to allow the thinning of one of the two assembled supports.

Figure 4:
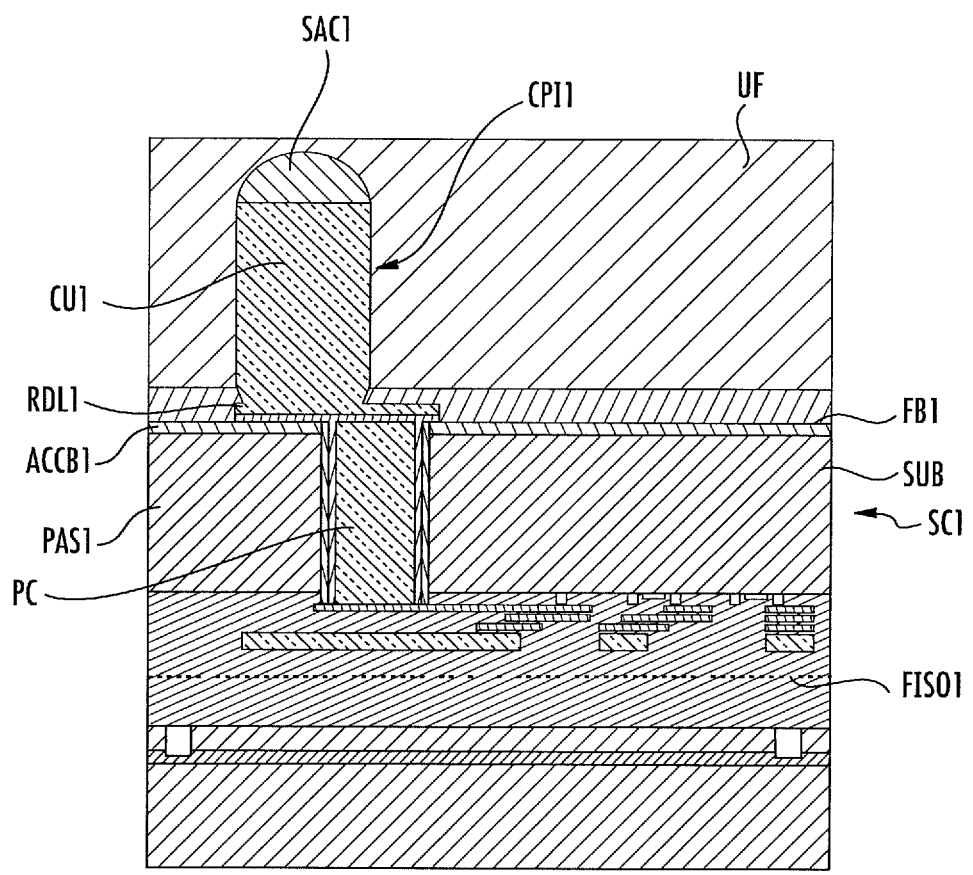
FIG. 4 is a cross-section view of the substrate being thinned, according to the present embodiment.

Thus, as illustrated in FIG. 4, the substrate SUB1 of the first semiconductor support SC1 can be thinned. This thinning is implemented from the face opposite to the front face FISO1 and enables the bottom of the conducting pillar PC to be reached. The pillar PC then opens onto a face FB1. In the neighborhood of this face FB1, a passivation layer PAS1 has also been formed, comprising, for example, silicon dioxide. A metal line, commonly referred to as redistribution line RDL1, is formed on the face FB1, in electrical contact with the pillar PC, on top of a layer ACCB1 forming a barrier and an adhesion layer. In contact with the redistribution line RDL1, a copper pillar CPI1 is formed comprising a column of copper CU1 and at its free end a layer of a low-temperature melting point alloy SAC1, for example, a layer comprising a tin-silver-copper alloy. Furthermore, a layer of polymer UF has been formed, for example, a layer of photoresist of the "pre-applied underfill" type, according to a terminology known to those skilled in the art.

It will be noted that the conducting pillar PC opening onto the face FB1 then forms an electrically conducting through-via. In addition, it is also possible to form an electrically conducting through-via of the "TSV last" type in electrical contact with the line LM11 after the thinning of the substrate SUB1. When an assembly of the "die to wafer" type is carried out, a step for dicing of the first support SC1 can be implemented.

Figure 5:
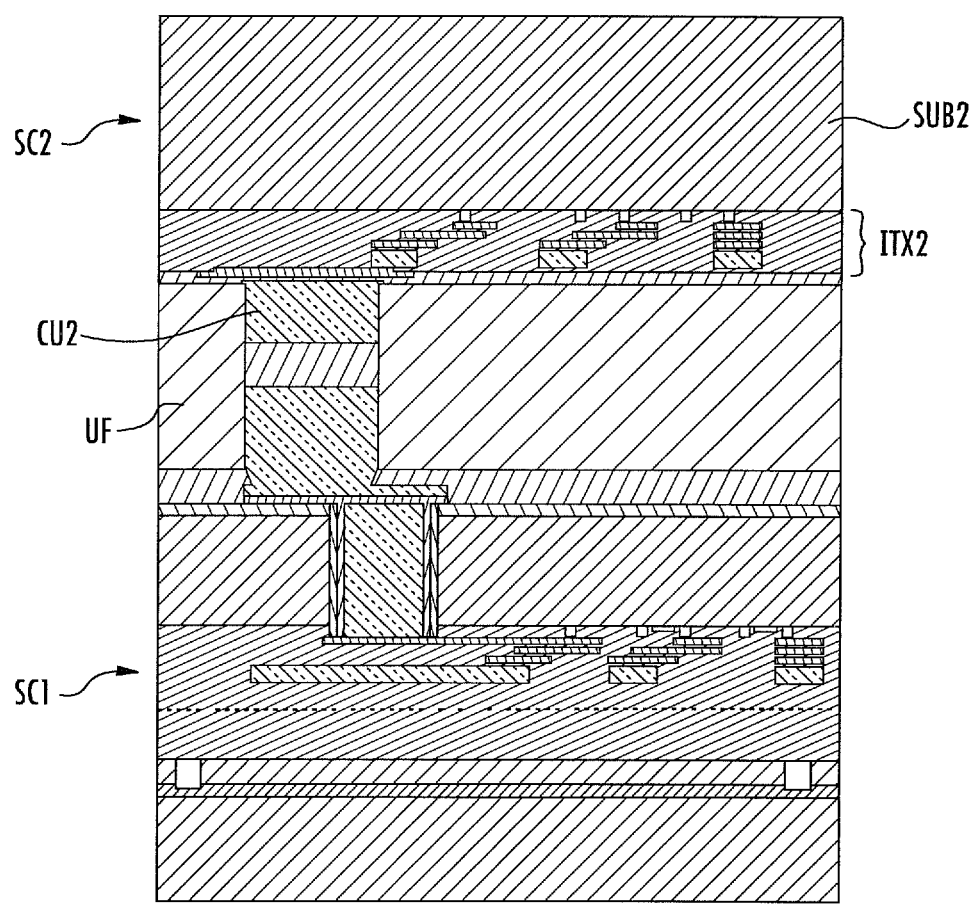
FIG. 5 is a cross-section view of the first support assembled with a second semiconductor support, according to the present embodiment.

The first support SC1 (potentially diced up) can then be assembled with a second semiconductor support SC2, as illustrated in FIG. 5. The support SC2 comprises here an interconnection network ITX2, a substrate SUB2, and a copper pillar CU2 in electrical contact with a line of the interconnection network ITX2. The copper pillar CU2 is protruding from a free face of the support SC2 and it is assembled with the pillar CPI1 of the support SC1. The layer of low-temperature melting point alloy SAC1 allows, after fusion, an electrical contact to be obtained between the pillar CU2 and the copper pillar CPI1. Such an assembly corresponds to a eutectic assembly. The layer of polymer UF fills the gap between the two semiconductor supports SC1 and SC2.

Figure 6:
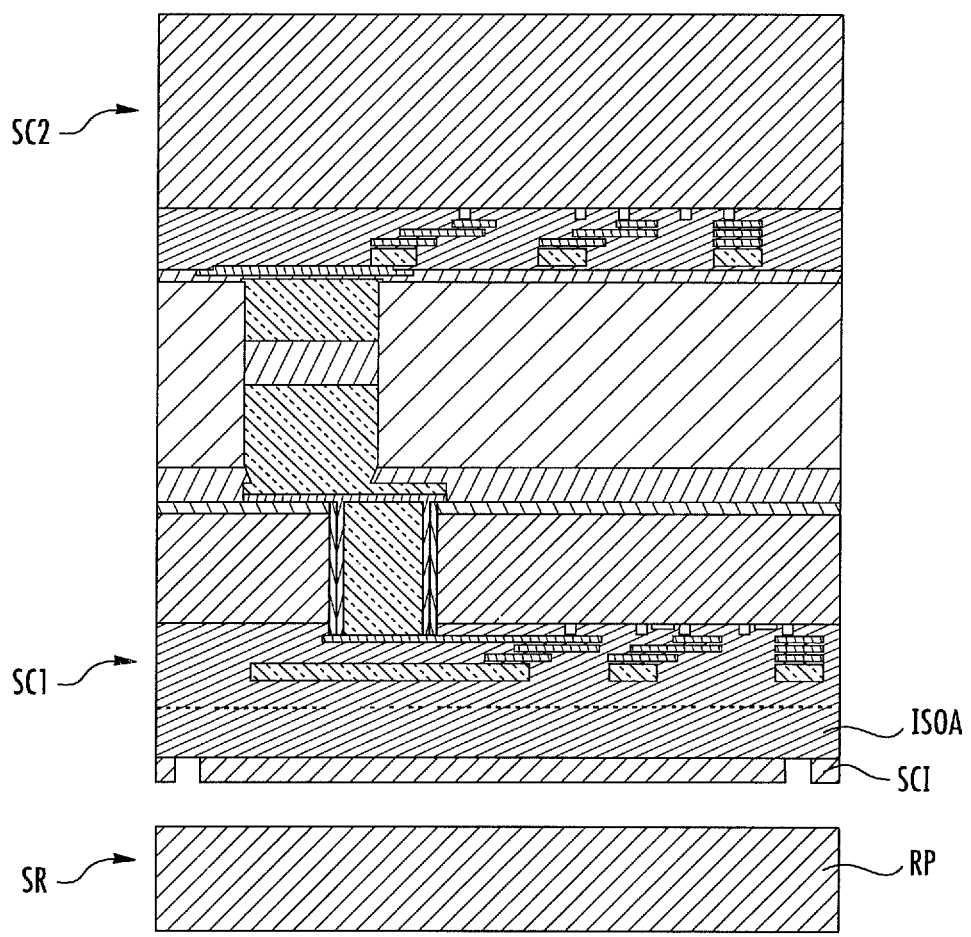
FIG. 6 is a cross-section view of the rigid support being removed, according to the present embodiment.

Once the assembly has been implemented, a part of the rigid support SR (FIG. 6) can be removed. For this purpose, a fracture can be formed within the porous region RP, for example, by inserting a blade into this region. The porous structure of this region will allow the fracture to propagate and to separate, on the one side, the rest of the rigid support SR and, on the other side, the intermediate semiconductor layer SCI, the additional insulating layer ISOA, and the two assembled semiconductor supports SC1 and SC2. The formation of a fracture avoids having to implement steps for the removal of an adhesive.

Figure 7:
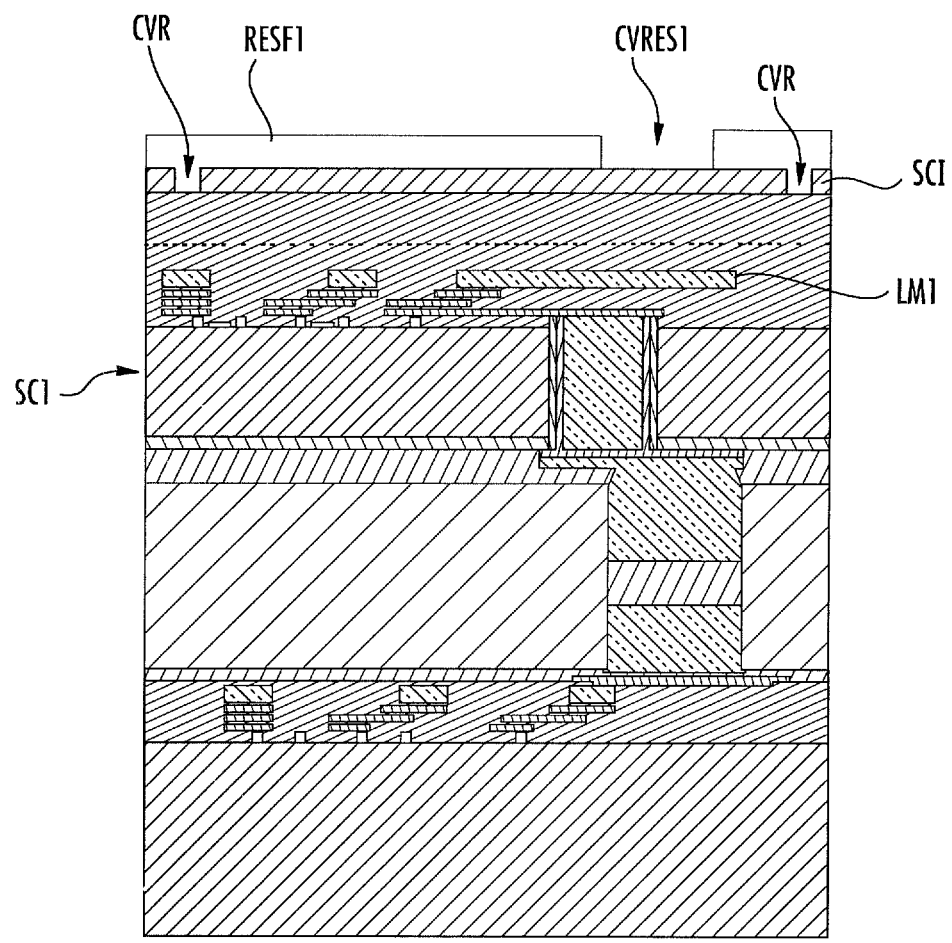
FIG. 7 is a cross-section view of the photoresist being deposited onto the intermediate semiconductor layer, according to the present embodiment.
Figure 8:
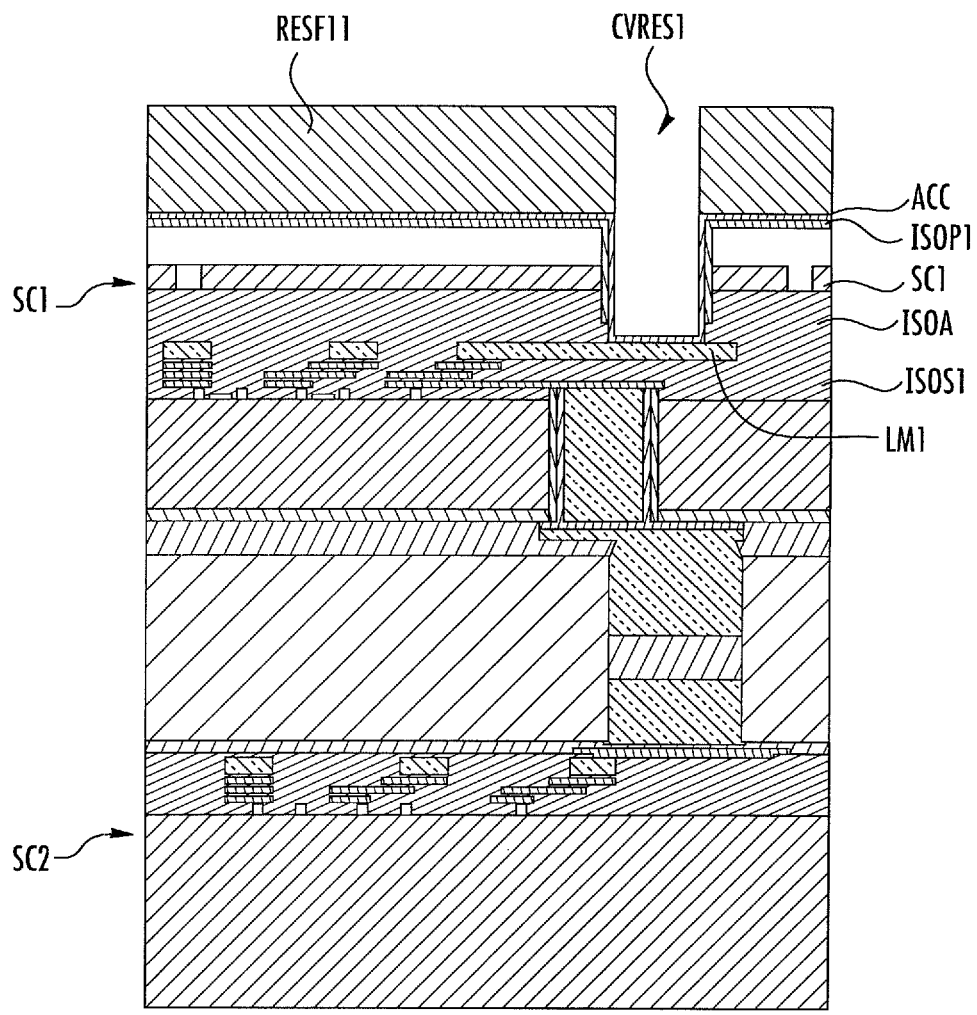
FIG. 8 is a cross-section view of the additional insulating layer and at least a part of the insulating region being etched from the cavity, according to the present embodiment.

An electrical contact can then be formed in the neighborhood of the front face of the first semiconductor support SC1. As illustrated in FIG. 7, a photoresist RESF1 can be deposited onto the intermediate semiconductor layer SCI capable of filling in the cavities CVR and of allowing the passivation of the layer SCI, then a photolithographic step can be implemented to form a cavity CVRES1, for example, on top of the metal line LM1. Subsequently, as illustrated in FIG. 8, the layer SCI, the additional insulating layer ISOA and at least a part of the insulating region ISOS1 can be etched from the cavity CVRES1, the cavity CVRES1 then being opened onto the line LM1.

In order to form a conducting pillar allowing the three-dimensional integrated structure formed by the two assembled supports SC1 and SC2 to be connected, an insulating layer ISOP1 and an adhesion and barrier layer ACCP1 are formed on the sidewalls of the cavity CVRES1 and on the layer of photoresist RESF1, the insulation layer ISOP1 being removed from the bottom of the cavity CVRES1. A layer of photoresist RESF11 is then formed to allow the formation of a copper pillar in electrical contact with the line LM1.

Figure 9:
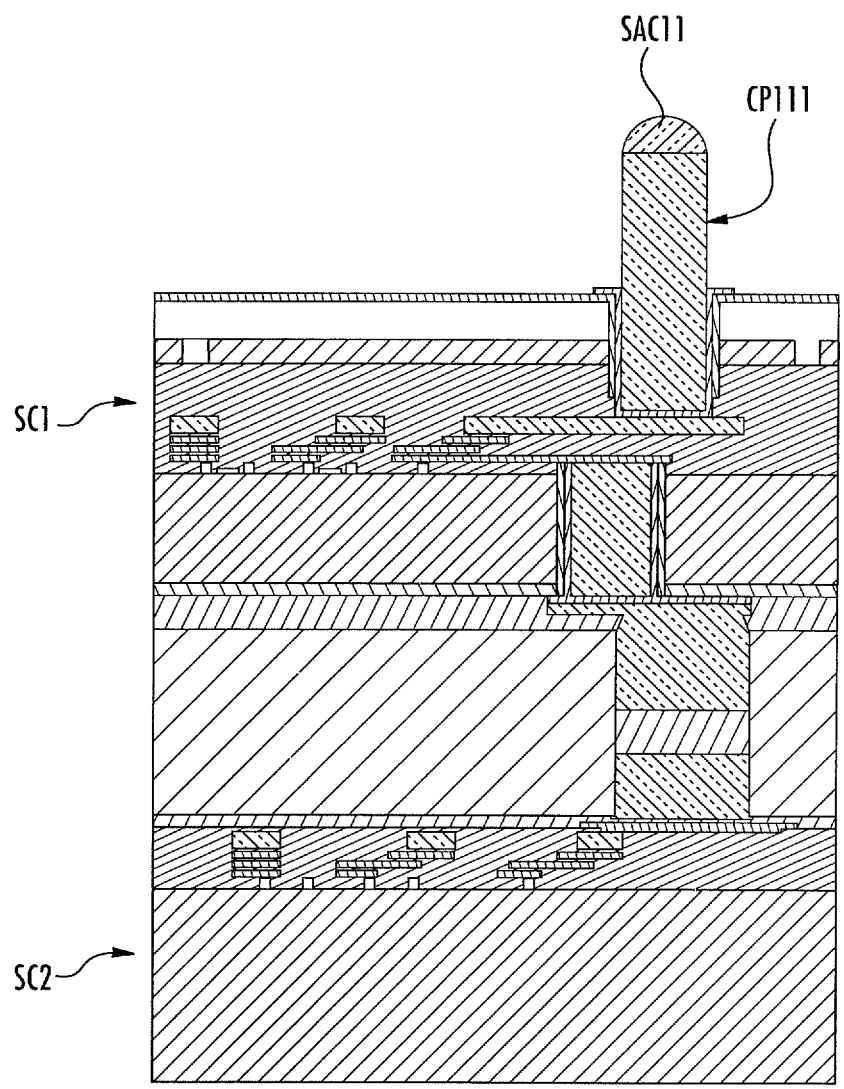
FIG. 9 is a cross-section view of an electrically conductive pillar is formed in a semiconductor device, according to the present embodiment.

As illustrated in FIG. 9, a copper pillar of the CPI11 type is formed, for example, by an electrochemical deposition step in which copper will be deposited into the cavity CVRES1 and will fill this cavity until the cavity formed in the photoresist RESF11 is full. A layer of low-temperature melting point alloy SAC11 is also formed at the free end of the pillar CPI11, for example, so as to allow the implementation of a "flip-chip" assembly, according to a terminology known to those skilled in the art. A three-dimensional integrated structure is obtained comprising the two assembled semiconductor supports SC1 and SC2, the thinning step for the first support SC1 not requiring the use of an adhesive for the fixing of the rigid support.

Figure 10:
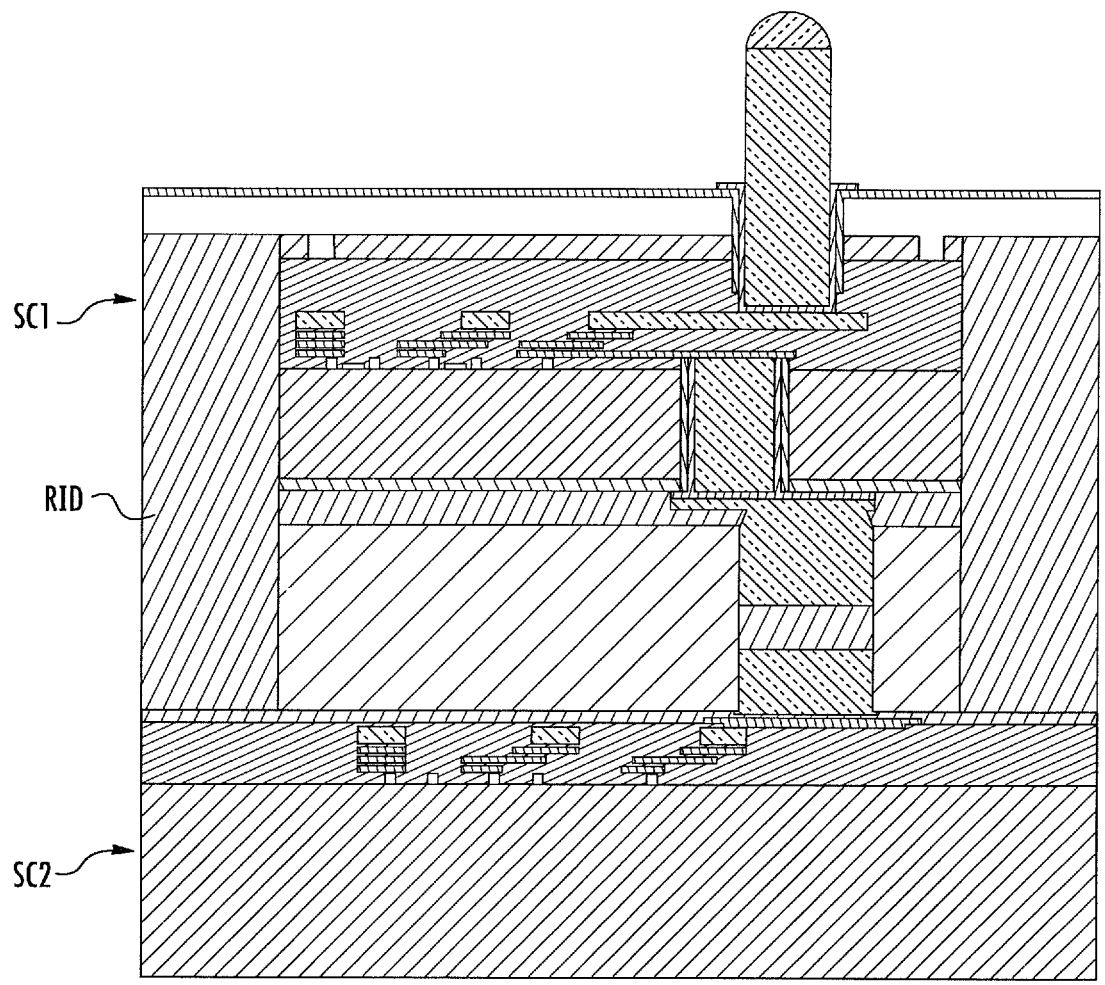
FIG. 10 is a cross-section view of an electrically conductive pillar is formed in a semiconductor device, according to another embodiment.

Furthermore, the structure shown in FIG. 9 can correspond to an assembly referred to as "wafer to wafer", and an embodiment with the assembly being an assembly of the "die to wafer" type will now be described with reference FIG. 10. In this figure, the first semiconductor support SC1 has been diced prior to the assembly step with the second semiconductor support SC2. A photoresist RID, commonly denoted by the terminology "polymer interdie filler", allows the gaps between the various parts of the first support SC1 having been diced to be filled. Furthermore, the removal of the rigid support SR by fracture has been implemented after the dicing and assembly steps.

That which is claimed is:

1. A method for making a semiconductor device having an electrically conductive through-via within a first semiconductor support having a front face and comprising a silicon substrate and an interconnection network adjacent the front face thereof, the method comprising:
    forming a first insulating layer on the front face of the first semiconductor support;
    forming a handle substrate comprising a porous layer, an intermediate semiconductor layer on the porous layer, and a second insulating layer on the intermediate semiconductor layer;
    direct bonding the first insulating layer and the second insulating layer;
    thinning the silicon substrate of the first semiconductor support so as to form a back face opposite to the front face;
    forming the electrically conductive through-via; and
    forming an electrically conductive pillar from a portion of the interconnection network, the conducting pillar passing through the first insulating layer of the first semiconductor support and the second insulating layer, the conducting pillar also protruding from a free face of the first semiconductor support opposite to the back face of the first semiconductor support.

2. The method of claim 1 wherein forming the electrically conductive through-via comprises forming the electrically conductive through-via from the back face subsequent to the thinning.

3. The method of claim 1 wherein forming the electrically conductive through-via comprises forming the electrically conductive through-via from the front face prior to the thinning, an electrical link then being exposed, after thinning, on the back face.

4. The method of claim 1 further comprising forming the porous layer by at least:
    implanting dopant atoms into the handle substrate so as to form a buried doped region on one side of the intermediate semiconductor layer;
    forming at least one cavity passing through the intermediate semiconductor layer and opening into the buried doped region; and
    forming of a plurality of pores in the buried doped region by an electrochemical process.

5. The method of claim 1 wherein the electrically conductive through-via is formed prior to the thinning by forming a conducting pillar extending from adjacent the front face of the first semiconductor support into the silicon substrate of the first semiconductor support.

6. The method of claim 1 wherein the back face of the first semiconductor support, from where the electrically conductive through-via comes out, is assembled with a front face of a second semiconductor support, the first semiconductor support and the handle substrate forming a three-dimensional integrated structure.

7. The method of claim 1 further comprising fracturing the porous layer so as to separate, on the one side, a residual semiconductor layer and the second insulating layer bonded to an insulating layer of the first semiconductor support, and on the other side, the rest of the handle substrate.

8. The method of claim 6 wherein the second semiconductor support is in a semiconductor wafer.

9. The method of claim 6 wherein the first semiconductor support is formed prior to the assembly step with the second semiconductor support within a semiconductor wafer, the first semiconductor support being diced before the assembly step.

10. A method for making a semiconductor device having an electrically conductive through-via within a first semiconductor support having a front face and comprising a silicon substrate and an interconnection network adjacent the front face thereof, the method comprising:
   forming a first insulating layer on the front face of the first semiconductor support;
   forming a handle substrate comprising a porous layer, an intermediate semiconductor layer on the porous layer, and a second insulating layer on the intermediate semiconductor layer, the porous layer formed via an electrochemical process;
   direct bonding the first insulating layer and the second insulating layer;
   thinning the silicon substrate of the first semiconductor support so as to form a back face opposite to the front face;
   forming the electrically conductive through-via; and
   forming an electrically conductive pillar from a portion of the interconnection network, the conducting pillar passing through the first insulating layer of the first semiconductor support and the second insulating layer, the conducting pillar also protruding from a free face of the first semiconductor support opposite to the back face of the first semiconductor support.

11. The method of claim 10 wherein forming the electrically conductive through-via comprises forming the electrically conductive through-via from the back face subsequent to the thinning.

12. The method of claim 10 wherein forming the electrically conductive through-via comprises forming the electrically conductive through-via from the front face prior to the thinning, an electrical link then being exposed, after thinning, on the back face.

13. The method of claim 10 further comprising forming the porous layer by at least:
   implanting dopant atoms into the handle substrate so as to form a buried doped region on one side of the intermediate semiconductor layer; and
   forming at least one cavity passing through the intermediate semiconductor layer and opening into the buried doped region.

14. The method of claim 10 wherein the electrically conductive through-via is formed prior to the thinning by forming a conducting pillar extending from adjacent the front face of the first semiconductor support into the silicon substrate of the first semiconductor support.

15. The method of claim 10 wherein the back face of the first semiconductor support, from where the electrically conductive through-via comes out, is assembled with a front face of a second semiconductor support, the first and second semiconductor supports forming a three-dimensional integrated structure.

16. The method of claim 10 further comprising fracturing the porous layer so as to separate, on the one side, a residual semiconductor layer and the second insulating layer bonded to an insulating layer of the first semiconductor support, and on the other side, the rest of the handle substrate.

17. The method of claim 15 wherein the second semiconductor support is in a semiconductor wafer.

18. The method of claim 15 wherein the first semiconductor support is formed prior to the assembly step with the second semiconductor support within a semiconductor wafer, the first semiconductor support being diced before the assembly step.

* * * * *